(12) United States Patent
Yim

(10) Patent No.: US 10,535,804 B2
(45) Date of Patent: Jan. 14, 2020

(54) LIGHT-EMITTING DEVICE PACKAGE

(71) Applicant: LG INNOTEK CO., LTD., Seoul (KR)

(72) Inventor: Bum Jin Yim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/746,211

(22) PCT Filed: Jul. 21, 2016

(86) PCT No.: PCT/KR2016/007957
§ 371 (c)(1),
(2) Date: Jan. 19, 2018

(87) PCT Pub. No.: WO2017/014580
PCT Pub. Date: Jan. 26, 2017

(65) Prior Publication Data
US 2018/0212111 A1    Jul. 26, 2018

(30) Foreign Application Priority Data
Jul. 22, 2015  (KR) .................. 10-2015-0103429

(51) Int. Cl.
*H01L 33/46* (2010.01)
*H01L 33/40* (2010.01)
(Continued)

(52) U.S. Cl.
CPC ............ *H01L 33/46* (2013.01); *H01L 33/385* (2013.01); *H01L 33/405* (2013.01); *H01L 33/42* (2013.01);
(Continued)

(58) Field of Classification Search
CPC ..... H01L 33/46; H01L 33/405; H01L 33/385; H01L 33/42; H01L 33/56; H01L 33/502;
(Continued)

(56) References Cited

U.S. PATENT DOCUMENTS 8,624,288 B2 * 1/2014 Jang .................... H01L 33/0079
257/98
2005/0145875 A1 7/2005 Kim et al.
(Continued)

FOREIGN PATENT DOCUMENTS

CN    104347773 A    2/2015
JP    2006-108161 A    4/2006
(Continued)

*Primary Examiner* — Syed I Gheyas
(74) *Attorney, Agent, or Firm* — Birch, Stewart, Kolasch & Birch, LLP

(57) ABSTRACT

A light-emitting device package of an embodiment includes a light-emitting structure including first and second conductive semiconductor layers and an active layer disposed between the first and second conductive semiconductor layers; a light-transmitting electrode layer disposed on the second conductive semiconductor layer; a passivation layer disposed on the second conductive semiconductor layer and a mesa-exposed portion of the first conductive semiconductor layer; a reflection layer disposed from the top of the light-transmitting electrode layer to the top of the passivation layer in a horizontal direction perpendicular to the thickness direction of the light-emitting structure; and a conductive capping layer disposed on the reflection layer.

20 Claims, 13 Drawing Sheets

(51) Int. Cl.
*H01L 33/62* (2010.01)
*H01L 33/38* (2010.01)
*H01L 33/42* (2010.01)
*H01L 33/50* (2010.01)
*H01L 33/56* (2010.01)
*H01L 33/44* (2010.01)
*H01L 33/06* (2010.01)
*H01L 33/30* (2010.01)
*H01L 33/32* (2010.01)

(52) U.S. Cl.
CPC ............ *H01L 33/502* (2013.01); *H01L 33/56* (2013.01); *H01L 33/62* (2013.01); *H01L 33/06* (2013.01); *H01L 33/30* (2013.01); *H01L 33/32* (2013.01); *H01L 33/38* (2013.01); *H01L 33/44* (2013.01)

(58) Field of Classification Search
CPC ......... H01L 33/62; H01L 33/38; H01L 33/06; H01L 33/30; H01L 33/32; H01L 33/44
See application file for complete search history.

(56) References Cited

U.S. PATENT DOCUMENTS

| | | | |
|---|---|---|---|
| 2006/0081869 A1* | 4/2006 | Lu | ........................ H01L 33/405 257/99 |
| 2006/0273335 A1 | 12/2006 | Asahara et al. | |
| 2013/0168721 A1 | 7/2013 | Hori et al. | |
| 2014/0231853 A1 | 8/2014 | Uemura | |
| 2015/0188011 A1 | 7/2015 | Kang | |

FOREIGN PATENT DOCUMENTS

| | | |
|---|---|---|
| JP | 2007-243074 A | 9/2007 |
| JP | 2011-34989 A | 2/2011 |
| JP | 4976849 B2 | 7/2012 |
| JP | 2014-158001 A | 8/2014 |
| KR | 10-2013-0065451 A | 6/2013 |
| KR | 10-2013-0067148 A | 6/2013 |
| KR | 10-2015-0078295 A | 7/2015 |
| KR | 10-2015-0079532 A | 7/2015 |

* cited by examiner

[FIG. 1]
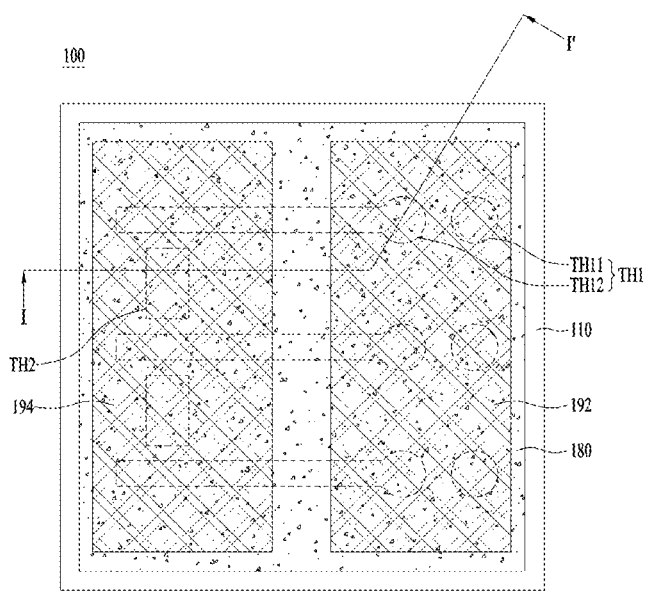
[FIG. 2]
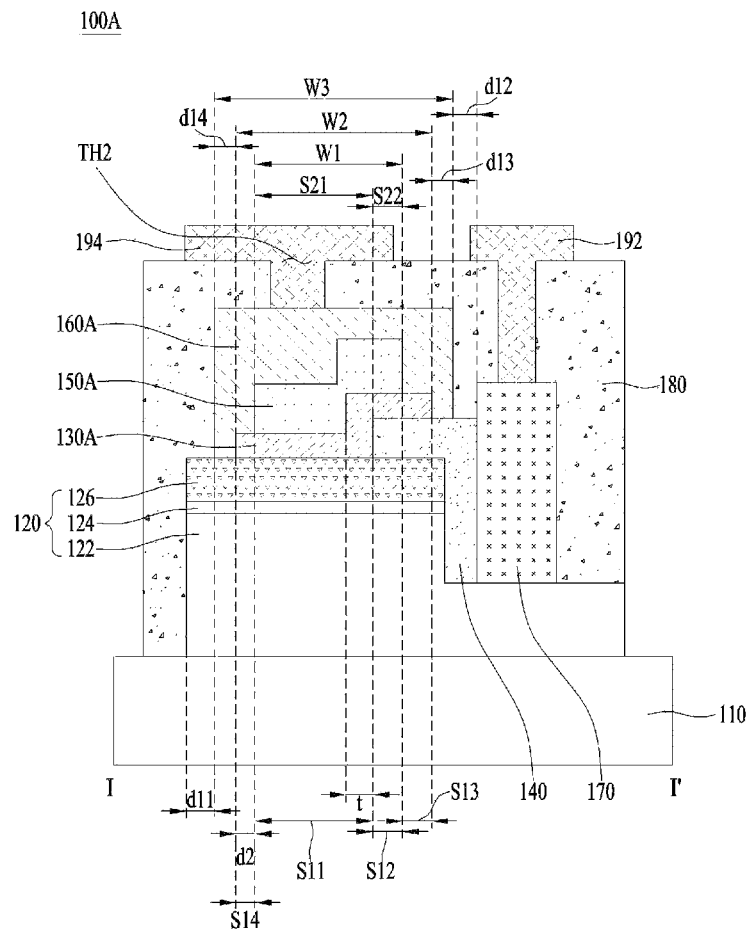

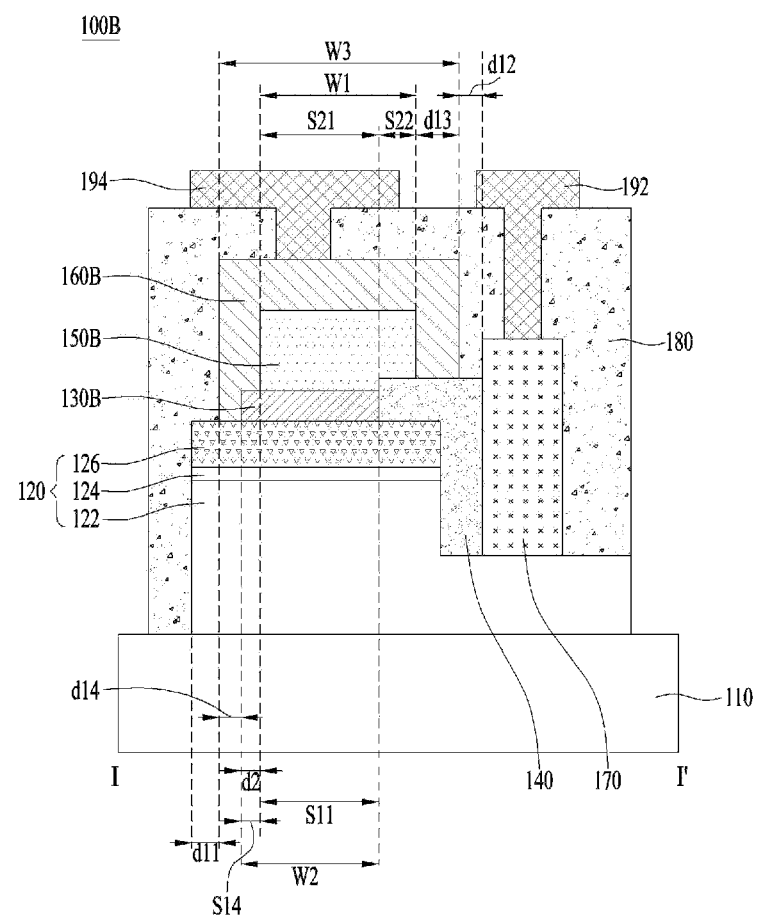
[FIG. 3]

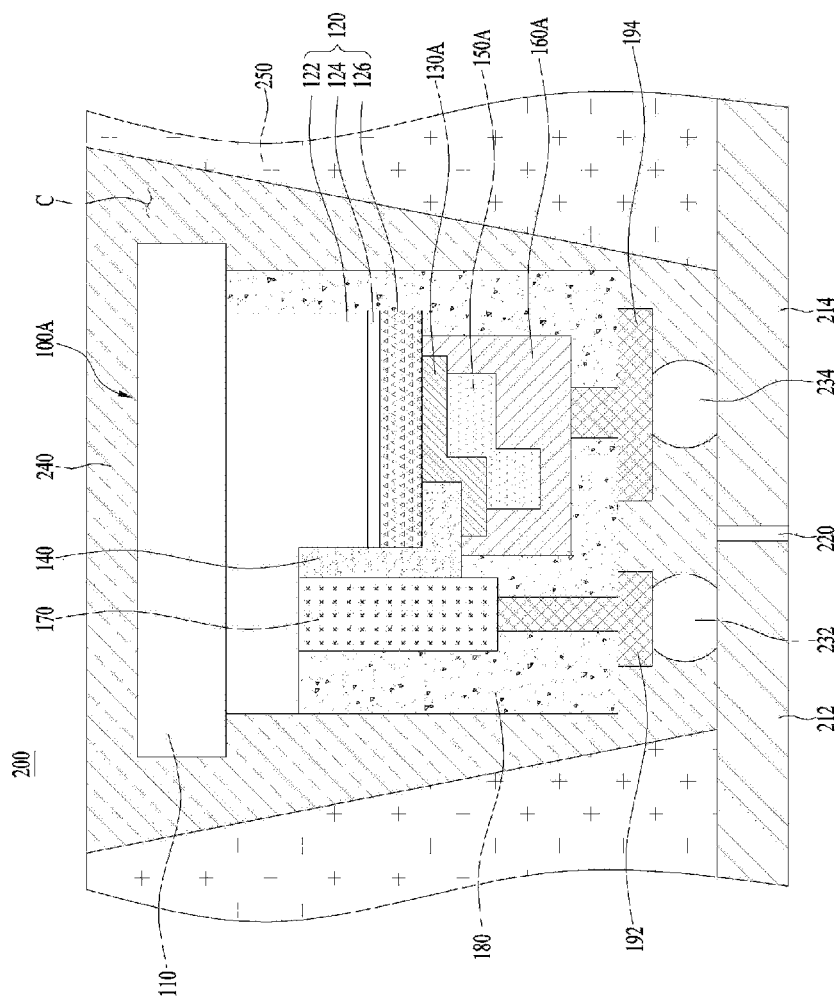
[FIG. 4]

[FIG. 5a]
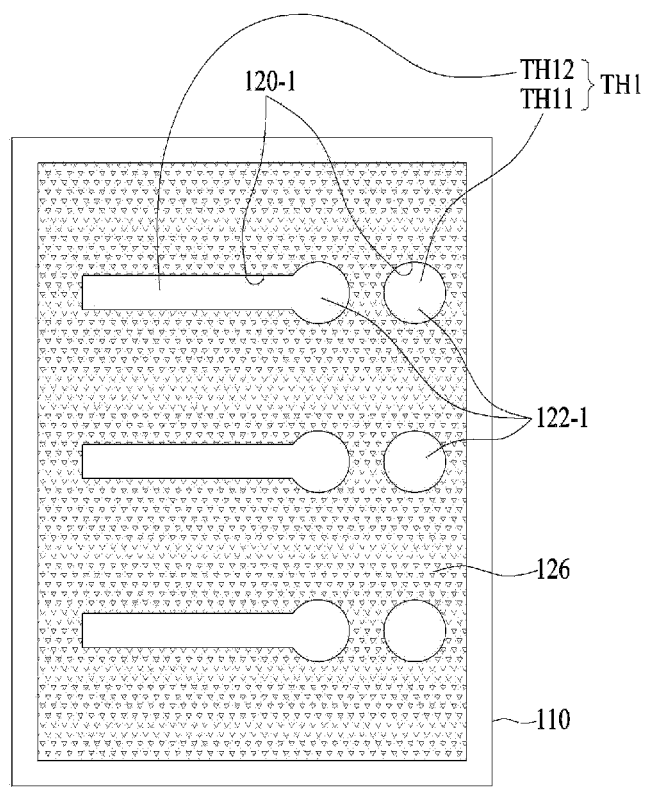

[FIG. 5b]
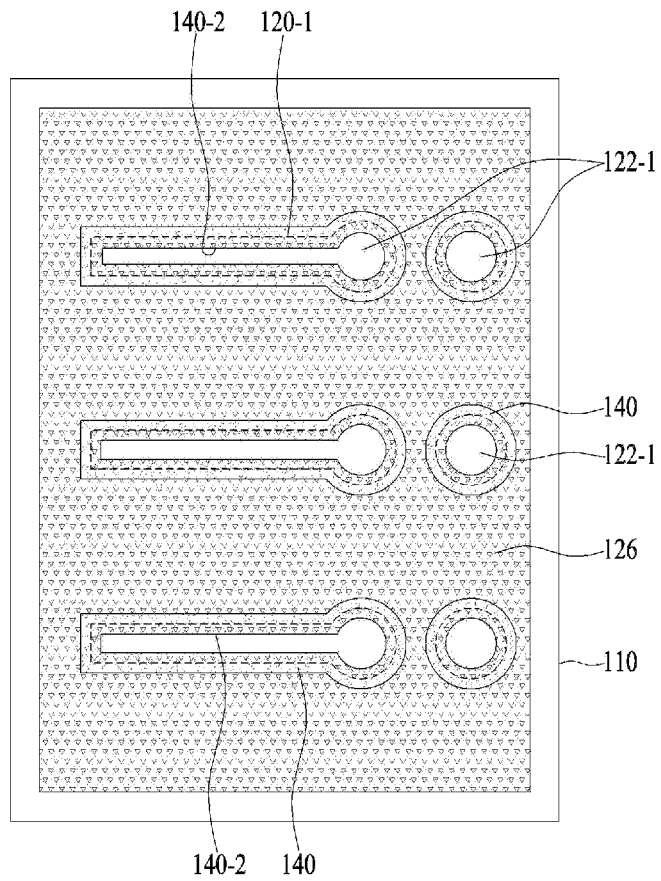

[FIG. 5c]
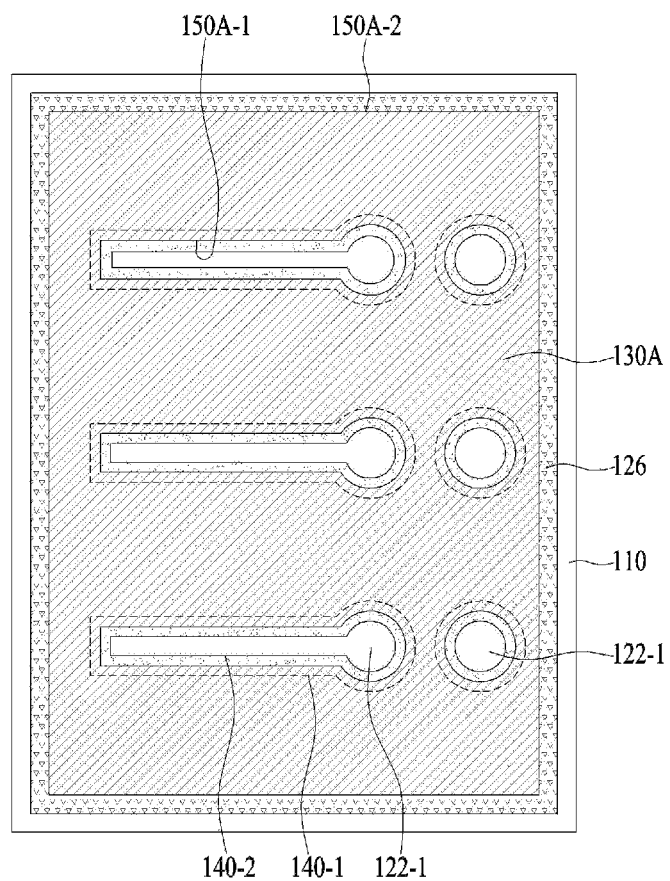

[FIG. 5d]
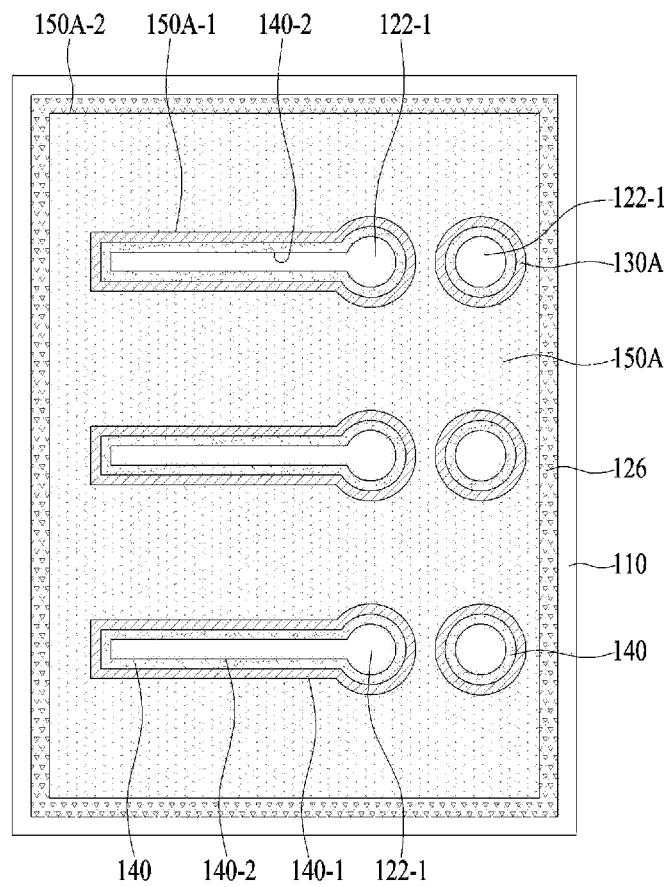

[FIG. 5e]
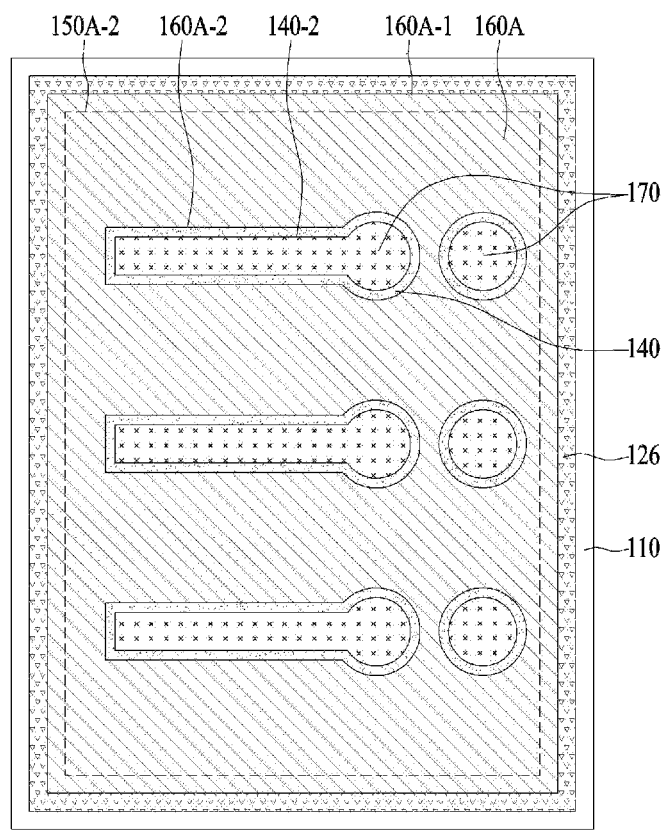

[FIG. 5f]
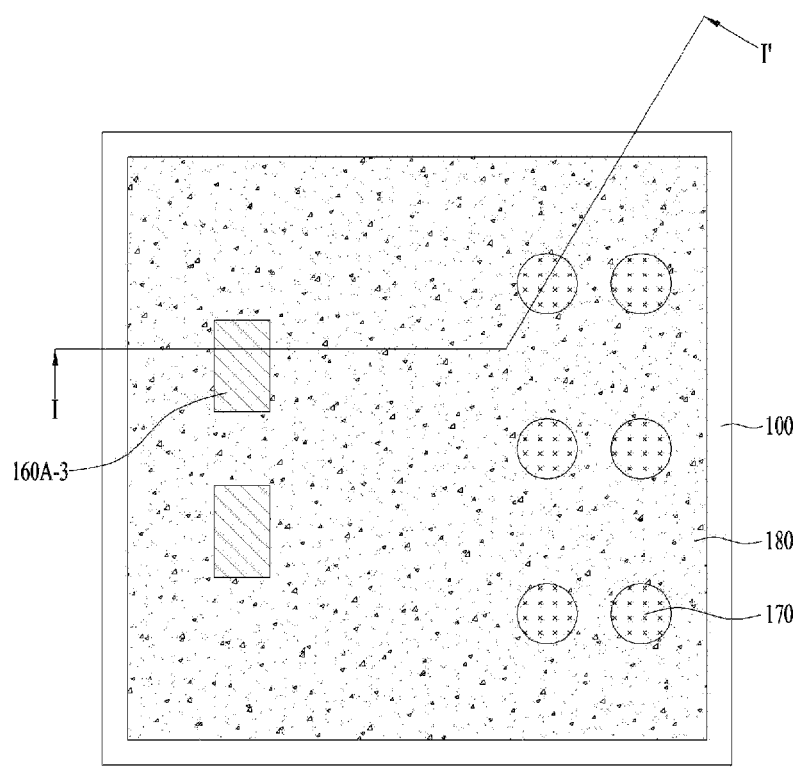

[FIG. 6a]
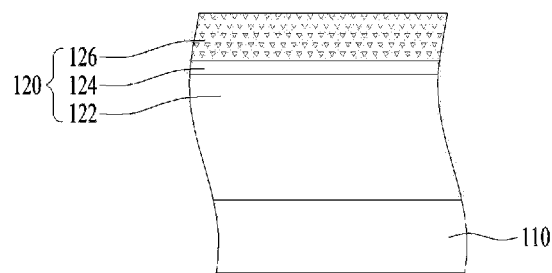
[FIG. 6b]
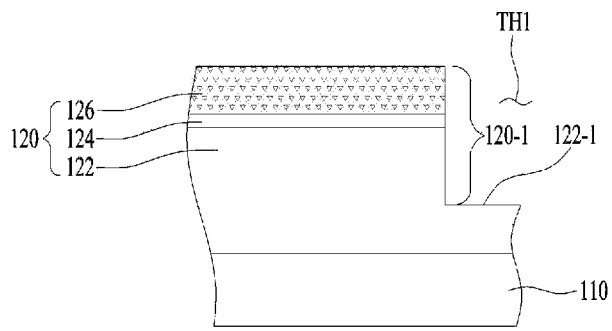
[FIG. 6c]
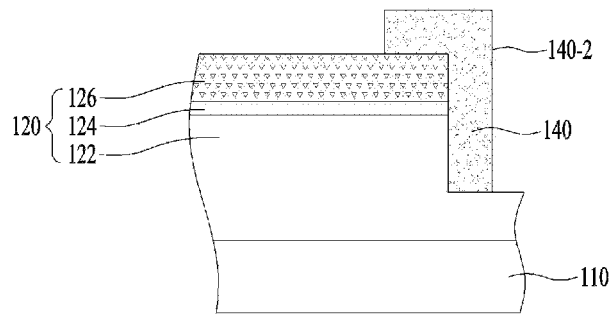

[FIG. 6d]
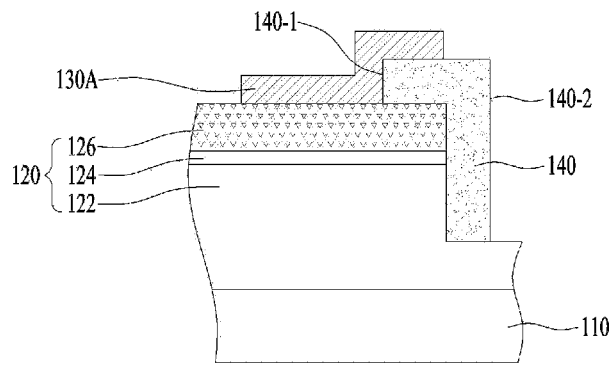
[FIG. 6e]
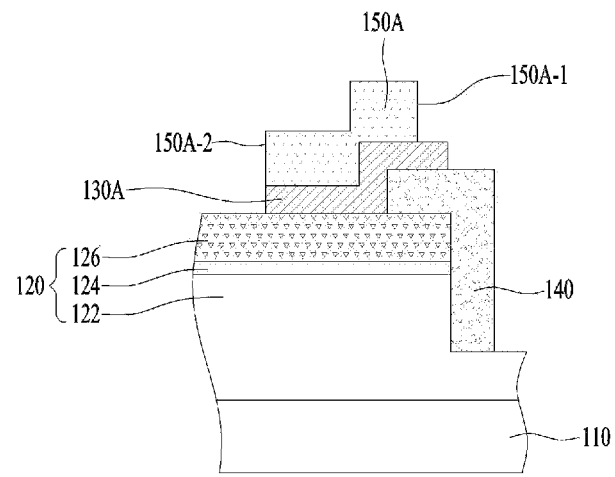
[FIG. 6f]
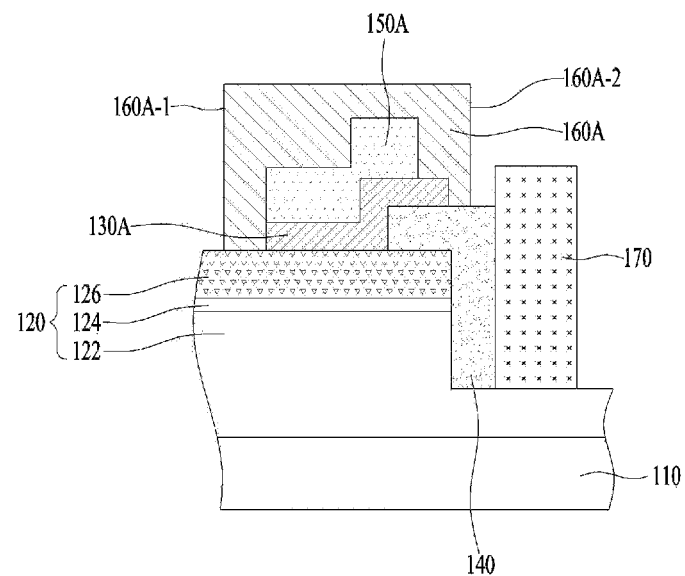

【FIG. 6g】
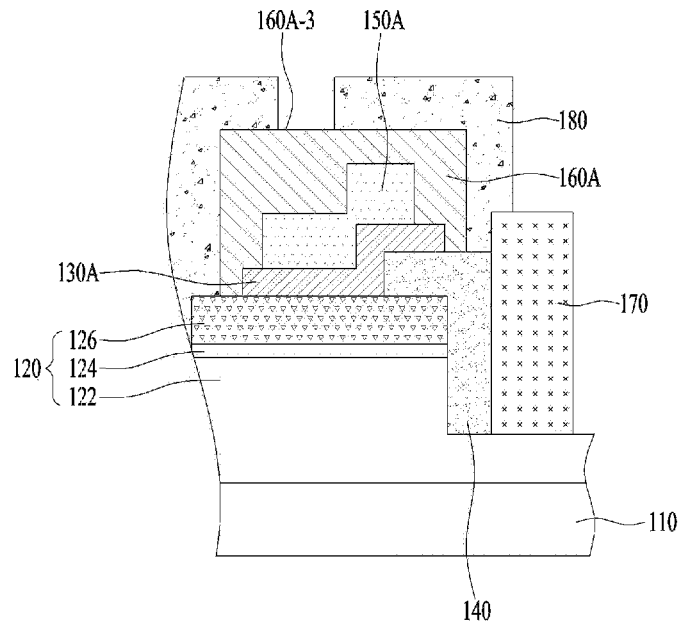
【FIG. 7a】
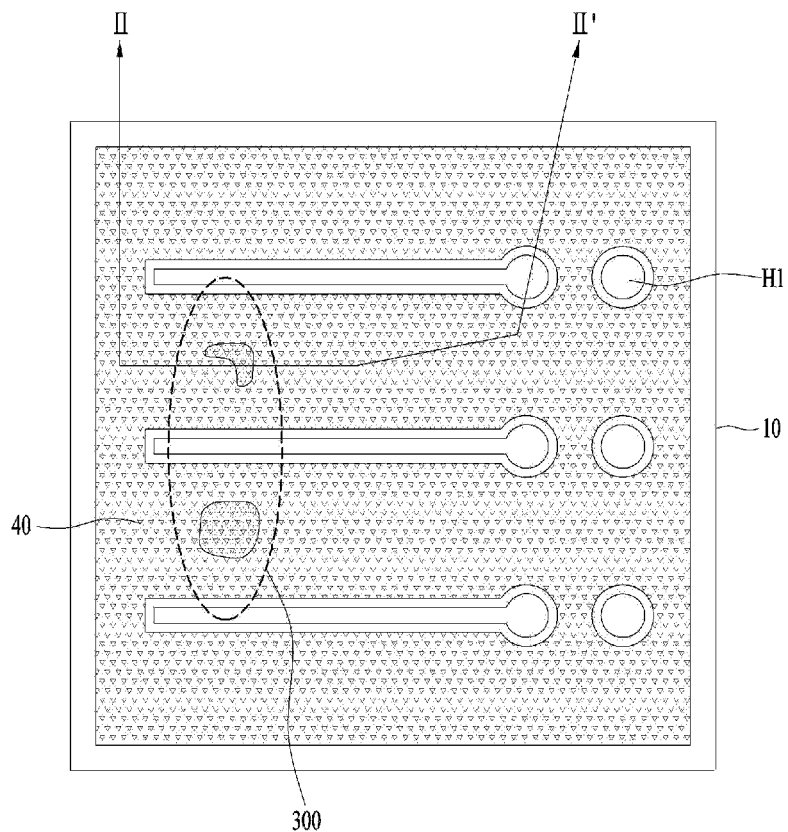

【FIG. 7b】
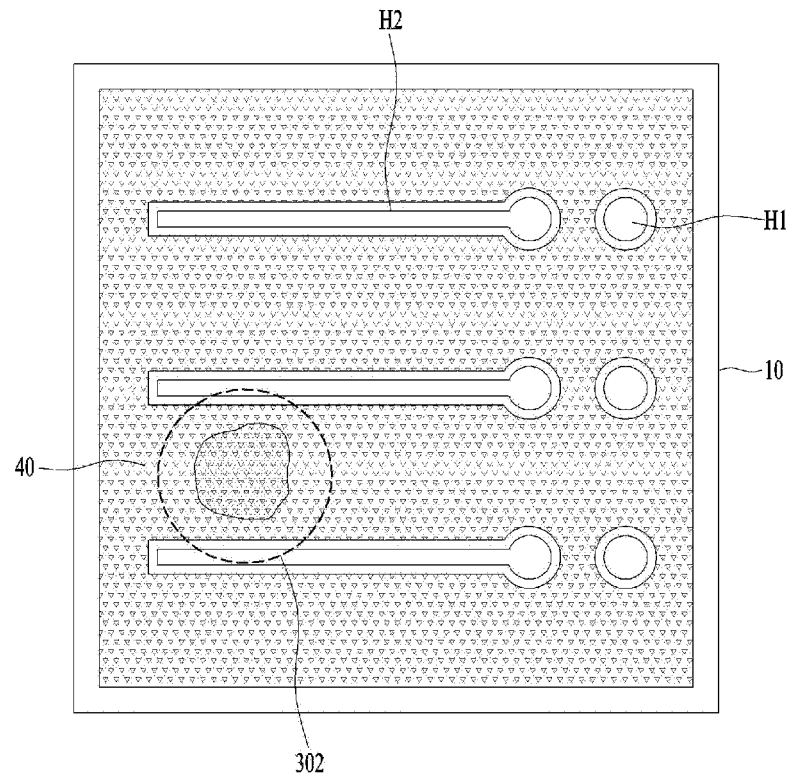
【FIG. 8】
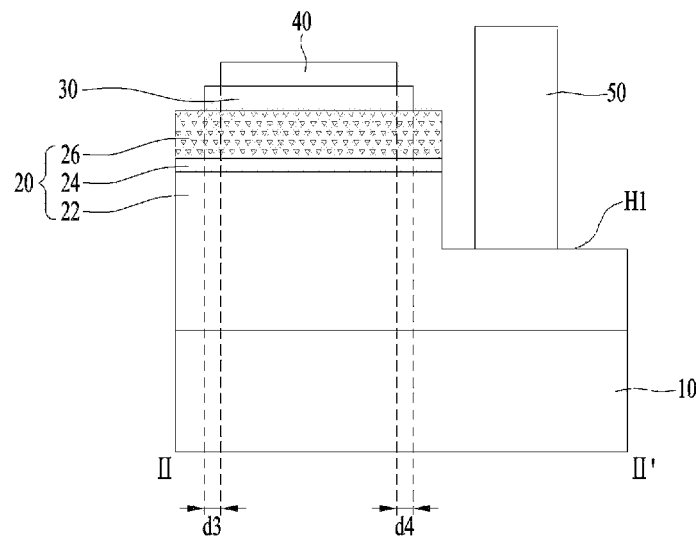

LIGHT-EMITTING DEVICE PACKAGE

CROSS REFERENCE TO RELATED APPLICATIONS

This application is the National Phase of PCT International Application No. PCT/KR2016/007957, filed on Jul. 21, 2016, which claims priority under 35 U.S.C. 119(a) to Patent Application No. 10-2015-0103429, filed in the Republic of Korea on Jul. 22, 2015, all of which are hereby expressly incorporated by reference into the present application.

TECHNICAL FIELD

Embodiments relate to a light-emitting device package.

BACKGROUND ART

A light-emitting diode (LED) is a kind of semiconductor device that converts electricity into infrared rays or light using the properties of a compound semiconductor to transmit or receive a signal or that is used as a light source.

Group III-V nitride semiconductors have attracted attention as a core material of a light-emitting device, such as a light-emitting diode (LED) or a laser diode (LD), thanks to the physical and chemical properties thereof.

The light-emitting diode exhibits excellent environmentally friendly characteristics, since the light-emitting diode does not include environmentally toxic materials, such as mercury (Hg), which is used in conventional lighting fixtures, such as incandescent lamps and fluorescent lamps. In addition, the light-emitting diode has advantages of a long lifespan and low power consumption. For these reasons, the light-emitting diode has replaced conventional light sources. Various kinds of research has been conducted to improve the reliability of a conventional light-emitting device package including such a light-emitting diode.

DISCLOSURE

Technical Problem

Embodiments provide a light-emitting device package having improved reliability.

Technical Solution

In one embodiment, a light-emitting device package may include a light-emitting structure including first and second conductive semiconductor layers and an active layer disposed between the first and second conductive semiconductor layers, a transparent electrode layer disposed on the second conductive semiconductor layer, a passivation layer disposed on the second conductive semiconductor layer and on the first conductive semiconductor layer, which is exposed by mesa etching, a reflective layer disposed so as to extend from the upper part of the transparent electrode layer to the upper part of the passivation layer in a horizontal direction, which is perpendicular to the thickness direction of the light-emitting structure, and a conductive capping layer disposed on the reflective layer.

For example, the light-emitting device package may further include a first electrode disposed on the first conductive semiconductor layer, which is exposed by the mesa etching, wherein the passivation layer may electrically isolate the side part of the light-emitting structure and the first electrode from each other, and the conductive capping layer may include the same material as the first electrode.

For example, each of the conductive capping layer and the first electrode may include at least one of Cr, Al, Ni, Cu, or Ti. For example, each of the conductive capping layer and the first electrode may include Cr/Al/Ni/Cu/Ni/Ti or Ti/Al. For example, the width of the conductive capping layer in the horizontal direction may be greater than the width of the transparent electrode layer in the horizontal direction. For example, the width of the reflective layer in the horizontal direction may be greater than the width of the transparent electrode layer in the horizontal direction. For example, the conductive capping layer may be disposed so as to surround the upper part and the side part of the reflective layer. The conductive capping layer may be disposed so as to wrap the side part of the transparent electrode layer on which the reflective layer is disposed.

For example, the reflective layer may include a first reflective segment disposed so as to overlap the light-emitting structure, the transparent electrode layer, and the conductive capping layer in the thickness direction and a second reflective segment extending from the first reflective segment in the horizontal direction so as to overlap the light-emitting structure, the conductive capping layer, and the passivation layer in the thickness direction.

For example, the second reflective segment may further overlap the transparent electrode layer in the thickness direction.

For example, the transparent electrode layer may include a first transparent segment disposed between the reflective layer and the light-emitting structure. The first transparent segment may be disposed so as to contact the passivation layer in the horizontal direction. The transparent electrode layer may further include a second transparent segment extending from the first transparent segment in the horizontal direction so as to be disposed between the reflective layer and the passivation layer. The transparent electrode layer may further include a third transparent segment extending from the second transparent segment in the horizontal direction so as to be disposed between the conductive capping layer and the passivation layer. The transparent electrode layer may further include a fourth transparent segment extending from the first transparent segment in the horizontal direction so as to be disposed between the conductive capping layer and the light-emitting structure. The reflective layer may be disposed on the fourth transparent segment.

For example, the light-emitting device package may further include a dielectric layer disposed between the conductive capping layer and the first electrode, a first pad connected to the first electrode by passing through the dielectric layer, and a second pad connected to the conductive capping layer by passing through the dielectric layer, the second pad being isolated from the first pad.

For example, the light-emitting device package may further include a first solder part connected to the first pad and a second solder part connected to the second pad.

For example, the light-emitting device package may further include first and second lead frames disposed so as to be electrically isolated from each other and a dielectric part disposed between the first and second lead frames, wherein the first solder part may be disposed between the first lead frame and the first pad, and the second solder part may be disposed between the second lead frame and the second pad.

For example, the light-emitting device package may further include a molding member disposed so as to surround the light-emitting structure.

Advantageous Effects

In the light-emitting device package according to the embodiment, the conductive capping layer is disposed so as to surround the reflective layer, whereby the reflective layer may be deposited on the entire surface of the transparent electrode layer. Consequently, the deposition area of the reflective layer may be increased. In addition, the migration, agglomeration, or peeling off of the reflective layer may be prevented. Furthermore, a material constituting the first and second solder parts may be prevented from diffusing to the reflective layer.

DESCRIPTION OF DRAWINGS

FIG. 1 is a plan view of a light-emitting device package according to an embodiment;

FIG. 2 is a sectional view of an embodiment of the light-emitting device package taken along line I-I' of FIG. 1;

FIG. 3 is a sectional view of another embodiment of the light-emitting device package taken along line I-I' of FIG. 1;

FIG. 4 is a sectional view of a light-emitting device package having a flip-chip bonding structure;

FIGS. 5a to 5f are process plan views illustrating a method of manufacturing the light-emitting device package shown in FIG. 2;

FIGS. 6a to 6g are process sectional views illustrating the method of manufacturing the light-emitting device package shown in FIG. 2;

FIGS. 7a and 7b are plan views of a light-emitting device package according to a comparative example; and FIG. 8 is a sectional view taken along II-II' of FIGS. 7a and 7b.

BEST MODE

Reference will now be made in detail to embodiments, examples of which are illustrated in the accompanying drawings. However, the present disclosure may be embodied in many different forms, and should not be construed as limited to the embodiments set forth herein. Rather, these embodiments are provided so that this disclosure will be thorough and complete, and will fully convey the disclosure to those skilled in the art.

In the following description of the embodiments, it will be understood that, when each element is referred to as being "on" or "under" another element, it can be "directly" on or under another element, or can be "indirectly" disposed in relation thereto such that an intervening element is present therebetween.

In addition, when an element is referred to as being 'on' or 'under', 'under the element' as well as 'on the element' can be included based on the element.

In addition, relational terms, such as "first," "second," "on/upper part/above" and "under/lower part/below," are used only to distinguish between one subject or element and another subject and element, without necessarily requiring or involving any physical or logical relationship or sequence between such subjects or elements.

FIG. 1 is a plan view of a light-emitting device package 100 according to an embodiment, and FIG. 2 is a sectional view of an embodiment 100A of the light-emitting device package 100 taken along line I-I' of FIG. 1.

The light-emitting device package 100 shown in FIG. 1 may have a sectional shape different from that shown in FIG. 2, and the light-emitting device package 100A shown in FIG. 2 may have a planar shape different from that shown in FIG. 1.

Referring to FIGS. 1 and 2, the light-emitting device package 100 or 100A according to the embodiment may include an upper substrate 110, a light-emitting structure 120, a transparent electrode layer 130A, a passivation layer 140, a reflective layer 150A, a conductive capping layer 160A, a first electrode 170, a dielectric layer 180, and first and second pads 192 and 194.

The light-emitting structure 120 is disposed on the upper substrate 110. The upper substrate 110 may include a conductive material or a nonconductive material. For example, the upper substrate 110 may include at least one of sapphire ($Al_2O_3$), GaN, SiC, ZnO, GaP, InP, $Ga_2O_3$, GaAs, or Si. However, the disclosure is not limited as to the material of the upper substrate 110.

In order to reduce the difference in coefficients of thermal expansion (CTE) and lattice unconformity between the upper substrate 110 and the light-emitting structure 120, a buffer layer (or a transition layer) (not shown) may be disposed between the upper substrate 110 and the light-emitting structure 120. For example, the buffer layer may be formed of at least one selected from among the group consisting of Al, In, N, and Ga. However, the disclosure is not limited thereto. In addition, the buffer layer may have a single- or multi-layer structure.

Hereinafter, the light-emitting device package 100 or 100A will be described as including the upper substrate 110. Depending on the circumstances, however, the upper substrate 110 may be omitted.

The light-emitting structure 120 may include a first conductive semiconductor layer 122, an active layer 124, and a second conductive semiconductor layer 126. The first conductive semiconductor layer 122, the active layer 124, and the second conductive semiconductor layer 126 may be sequentially stacked in the direction in which the first and second pads 192 and 194 are viewed from the upper substrate 110.

The first conductive semiconductor layer 122 may be disposed on the upper substrate 110. The first conductive semiconductor layer 122 may be formed of a semiconductor compound, and may be embodied by a group III-V or II-VI compound semiconductor doped with a first conductive dopant. In the case in which the first conductive semiconductor layer 122 is an n-type semiconductor layer, the first conductive dopant may include Si, Ge, Sn, Se, or Te as an n-type dopant. However, the disclosure is not limited thereto.

For example, the first conductive semiconductor layer 122 may include a semiconductor material described by the formula $Al_xIn_yGa_{(1-x-y)}N$ ($0 \le x \le 1$, $0 \le y \le 1$, $0 \le x+y \le 1$). The first conductive semiconductor layer 122 may include at least one of GaN, InN, AlN, InGaN, AlGaN, InAlGaN, AlInN, AlGaAs, InGaAs, AlInGaAs, GaP, AlGaP, InGaP, AlInGaP, or InP.

The active layer 124 may be disposed between the first conductive semiconductor layer 122 and the second conductive semiconductor layer 126. The active layer 124 is a layer in which electrons (or holes) injected through the first conductive semiconductor layer 122 and holes (or electrons) injected through the second conductive semiconductor layer 126 are coupled in order to emit light having energy set by the inherent energy band of the material constituting the active layer 124. The active layer 124 may be formed so as to have at least one of a single-well structure, a multi-well structure, a single-quantum-well structure, a multi-quantum-well (MQW) structure, a quantum-wire structure, or a quantum-dot structure.

A well layer/barrier layer of the active layer 124 may be formed so as to include at least one of InGaN/GaN, InGaN/InGaN, GaN/AlGaN, InAlGaN/GaN, GaAs(InGaAs)/AlGaAs, or GaP(InGaP)/AlGaP, which are pairs of structures. However, the disclosure is not limited thereto. The well layer may be formed of a material having lower band gap energy than the barrier layer.

A conductive clad layer (not shown) may be formed on and/or under the active layer 124. The conductive clad layer may be formed of a semiconductor having higher band gap energy than the barrier layer of the active layer 124. For example, the conductive clad layer may include GaN, AlGaN, InAlGaN, or a super-lattice structure. In addition, the conductive clad layer may be doped as an n-type or p-type semiconductor.

In this embodiment, the active layer 124 may emit light in an ultraviolet wavelength band. Here, the ultraviolet wavelength band is a wavelength band ranging from 100 nm to 400 nm. In particular, the active layer 124 may emit light in a wavelength band ranging from 100 nm to 280 nm. However, the disclosure is not limited as to the wavelength of the light emitted by the active layer 124.

The second conductive semiconductor layer 126 may be disposed on the active layer 124. The second conductive semiconductor layer 126 may be formed of a compound semiconductor, and may be embodied by a group III-V or II-VI compound semiconductor. For example, the second conductive semiconductor layer 126 may include a semiconductor material described by the formula $In_xAl_yGa_{(1-x-y)}N$ ($0 \leq x \leq 1$, $0 \leq y \leq 1$, $0 \leq x+y \leq 1$). The second conductive semiconductor layer 126 may be doped with a second conductive dopant. In the case in which the second conductive semiconductor layer 126 is a p-type semiconductor layer, the second conductive dopant may include Mg, Zn, Ca, Sr, or Ba as a p-type dopant.

The first conductive semiconductor layer 122 may be embodied by an n-type semiconductor layer, and the second conductive semiconductor layer 126 may be embodied by a p-type semiconductor layer. Alternatively, the first conductive semiconductor layer 122 may be embodied by a p-type semiconductor layer, and the second conductive semiconductor layer 126 may be embodied by an n-type semiconductor layer.

The light-emitting structure 120 may be embodied so as to have any one of an n-p junction structure, a p-n junction structure, an n-p-n junction structure, and a p-n-p junction structure.

FIG. 3 is a sectional view of another embodiment 100B of the light-emitting device package 100 taken along line I-I' of FIG. 1.

The light-emitting device package 100B shown in FIG. 3 may include an upper substrate 110, a light-emitting structure 120, a transparent electrode layer 130B, a passivation layer 140, a reflective layer 150B, a conductive capping layer 160B, a first electrode 170, a dielectric layer 180, and first and second pads 192 and 194. Here, the upper substrate 110, the light-emitting structure 120, the first electrode 170, the dielectric layer 180, and the first and second pads 192 and 194 shown in FIG. 3 correspond respectively to the upper substrate 110, the light-emitting structure 120, the first electrode 170, the dielectric layer 180, and the first and second pads 192 and 194 shown in FIG. 2. Consequently, the description of the components 110, 120, 170, 180, 192, and 194 of the light-emitting device package 100A shown in FIG. 2 may equally apply to the light-emitting device package 100A shown in FIG. 3, and therefore a detailed description of the components 110, 120, 170, 180, 192, and 194 of the light-emitting device package 100A shown in FIG. 3 will be omitted.

The light-emitting device package 100 shown in FIG. 1 may have a sectional shape different from that shown in FIG. 3, and the light-emitting device package 100B shown in FIG. 3 may have a planar shape different from that shown in FIG. 1.

Referring to FIGS. 2 and 3, the transparent electrode layer 130A or 130B is disposed on the second conductive semiconductor layer 126. The transparent electrode layer 130A or 130B may be formed of a transparent conductive oxide (TCO). For example, the transparent electrode layer 130A or 130B may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO. However, the disclosure is not limited thereto.

The transparent electrode layer 130A or 130B may include at least one of first, second, third, or fourth transparent segment S11, S12, S13, or S14.

In one embodiment, as shown in FIG. 2, the transparent electrode layer 130A may include all of the first to fourth transparent segments S11, S12, S13, and S14.

Referring to FIG. 2, the first transparent segment S11 of the transparent electrode layer 130A may be disposed between the reflective layer 150A and the light-emitting structure 120. For example, as shown in FIG. 2, the first transparent segment S11 may be disposed so as to directly contact the reflective layer 150A and to directly contact the light-emitting structure 120.

The second transparent segment S12 may extend from the first transparent segment S11 in a horizontal direction so as to be disposed between the reflective layer 150A and the passivation layer 140. Here, the horizontal direction may be a direction that intersects the thickness direction of the light-emitting structure 120, e.g. a direction that is perpendicular to the thickness direction of the light-emitting structure 120. For example, as shown in FIG. 2, the second transparent segment S12 may be disposed so as to directly contact the reflective layer 150A and to directly contact the passivation layer 140.

The third transparent segment S13 may extend from the second transparent segment S12 in the horizontal direction so as to be disposed between the conductive capping layer 160A and the passivation layer 140.

In FIG. 2, the width of the third transparent segment S13 may be 0 μm, since the conductive capping layer 160A is disposed so as to surround the reflective layer 150A. If the width of the third transparent segment S13 is greater than 10 μm, the area of the reflective layer 150A is reduced, whereby light may be lost. Consequently, the width of the third transparent segment S13 may be in the range from 0 μm to 10 μm. However, the disclosure is not limited thereto.

The fourth transparent segment S14 may extend from the first transparent segment S11 in the horizontal direction so as to be disposed between the conductive capping layer 160A and the light-emitting structure 120.

In FIG. 2, the reflective layer 150A is shown as being disposed on the first and second transparent segments S11 and S12 and as not being disposed on the third and fourth transparent segments S13 and S14. However, the disclosure is not limited thereto. That is, the reflective layer 150A may extend so as to be disposed on at least one of the third or fourth transparent segment S13 or S14. That is, the width of the fourth transparent segment S14 may be '0' or more.

In another embodiment, as shown in FIG. 3, the transparent electrode layer 130B may include only the first and fourth transparent segments S11 and S14.

The first transparent segment S11 of the transparent electrode layer 130B shown in FIG. 3 is disposed between the reflective layer 150B and the light-emitting structure 120. On the light-emitting structure 120, the first transparent segment S11 and the passivation layer 140 may be disposed so as to contact each other. That is, the side part of the first transparent segment S11 and the side part of the passivation layer 140 may contact each other on the light-emitting structure 120.

The fourth transparent segment S14 may extend from the first transparent segment S11 in a direction that intersects the thickness direction of the light-emitting structure 120, e.g. the horizontal direction, which is a direction that is perpendicular to the thickness direction of the light-emitting structure 120, so as to be disposed between the conductive capping layer 160B and the light-emitting structure 120.

Meanwhile, the reflective layer 150A or 150B may extend from the upper part of the transparent electrode layer 130A or 130B to the upper part of the passivation layer 140 in a direction that intersects the thickness direction of the light-emitting structure 120, e.g. the horizontal direction, which is a direction that is perpendicular to the thickness direction of the light-emitting structure 120. In this embodiment, the reflective layer 150A or 150B may extend so as to be disposed on the passivation layer 140 as well as the transparent electrode layer 130A or 130B.

In addition, as shown in FIG. 2, the first width W1 of the reflective layer 150A in the horizontal direction may be less than the second width W2 of the transparent electrode layer 130A in the horizontal direction. Alternatively, as shown in FIG. 3, the first width W1 of the reflective layer 150B may be greater than the second width W2 of the transparent electrode layer 130B. The first and second widths W1 and W2 are values set based on the overall size of the light-emitting device package 100A or 100B. The disclosure is not limited to the specific values of the first and second widths W1 and W2. Referring to FIGS. 2 and 3, the reflective layer 150A or 150B may include first and second reflective segments S21 and S22.

The first reflective segment S21 may be disposed so as to overlap the light-emitting structure 120, the transparent electrode layer 130A or 130B, and the conductive capping layer 160A or 160B in the thickness direction of the light-emitting structure 120. In particular, the first reflective segment S21 may be disposed so as to overlap the first transparent segment S11 of the transparent electrode layer 130A or 130B in the thickness direction.

In one embodiment, as shown in FIG. 2, the second reflective segment S22 may extend from the first reflective segment S21 in the horizontal direction so as to overlap the light-emitting structure 120, the passivation layer 140, the transparent electrode layer 130A, and the conductive capping layer 160A in the thickness direction. In particular, in FIG. 2, the second reflective segment S22 may be disposed so as to overlap the second transparent segment S12 of the transparent electrode layer 130A in the thickness direction of the light-emitting structure 120.

In another embodiment, the second reflective segment S22 shown in FIG. 3 is not disposed so as to overlap the transparent electrode layer 130B in the thickness direction of the light-emitting structure 120, unlike what is shown in FIG. 2. That is, the second reflective segment S22 shown in FIG. 3 may be disposed so as to overlap the conductive capping layer 160B, the passivation layer 140, and the light-emitting structure 120 in the thickness direction.

The reflective layer 150A or 150B may be formed of a material that is capable of reflecting the light emitted from the active layer 124. For example, the reflective layer 150A or 150B may include Ag, Al, Ru, Rh, Pt, Pd, or a selective combination thereof. The passivation layer 140 may be disposed from the top of the second conductive semiconductor layer 126 to the top of the first conductive semiconductor layer 122, which has been exposed by mesa etching, while surrounding the sidewall of the light-emitting structure 120. Consequently, the first electrode 170 and the light-emitting structure 120 may be electrically isolated from each other by the passivation layer 140.

In FIG. 2, the passivation layer 140 is disposed between the transparent electrode layer 130A and the light-emitting structure 120, and is also disposed under the conductive capping layer 160A. Also, in FIG. 3, the passivation layer 140 may be disposed between the reflective layer 150B and the light-emitting structure 120, and may also be disposed under the conductive capping layer 160A. Particularly, in FIG. 3, the passivation layer 140 is not disposed under the transparent electrode layer 130B, unlike what is shown in FIG. 2.

Meanwhile, the conductive capping layer 160A or 160B may be disposed on the reflective layer 150A or 150B. In addition, as shown in FIGS. 2 and 3, the conductive capping layer 160A or 160B may be disposed so as to wrap the upper part and the side part of the reflective layer 150A or 150B. The conductive capping layer 160A or 160B may be disposed so as to surround the side part of the transparent electrode layer 130A or 130B on which the reflective layer 150A or 150B is disposed. The shorter the 1-1 distance d11 between the left end of the conductive capping layer 160A or 160B and the sidewall of the light-emitting structure 120, the wider the transparent electrode layer 130A or 130B and the reflective layer 150A or 150B that may be disposed on the light-emitting structure 120.

For example, if the 1-1 distance d11 is less than 5 μm, process defects may occur. That is, the minimum value of the 1-1 distance d11 may be 5 μm in consideration of a process margin. In addition, if the value of the second width W2 is fixed and the 1-1 distance d11 is greater than 10 μm, the thickness of the conductive capping layer 160A or 160B is reduced, whereby the capping function thereof may not be appropriately performed. As a result, migration of metal, such as silver, may occur. Consequently, the 1-1 distance d11 may range from 5 μm to 10 μm. However, the disclosure is not limited thereto.

The first electrode 170 may be disposed on the top of the first conductive semiconductor layer 122, which has been exposed by mesa etching, so as to be electrically connected to the first conductive semiconductor layer 122. That is, the second conductive semiconductor layer 126, the active layer 124, and a portion of the first conductive semiconductor layer 122 are etched by mesa etching to form a first through-hole TH1, which is formed by passing through the second conductive semiconductor layer 126 and the active layer 124 so as to expose the first conductive semiconductor layer 122. The first electrode 170 is formed on the first conductive semiconductor layer 122, which is exposed through the first through-hole TH1.

For easy understanding, in FIG. 1, the first through-hole TH1, which is covered by the first pad 192 and the dielectric layer 180, is indicated by a dotted line, and a second through-hole TH2, which is covered by the second pad 194, is indicated by a dotted line. In addition, for the convenience of description, in FIG. 1, the first electrode 170 and the first through-hole TH1 are shown as being identical to each other. The first through-hole TH1 may have the shape shown in FIGS. 5a and 6b, which will be described below. Also, in FIG. 1, the number of first through-holes TH1 is shown as being 6. However, the disclosure is not limited thereto. That is, the number of first through-holes TH1 may be greater or less than 6.

In this embodiment, the conductive capping layer 160A or 160B may include the same material as the first electrode 170. As will be described below, the first electrode 170 and the conductive capping layer 160A or 160B may be formed simultaneously.

In addition, the first electrode 170 may include an ohmic contact material so as to perform an ohmic function. Consequently, an additional ohmic layer (not shown) may not be disposed. Alternatively, an additional ohmic layer may be disposed on or under the first electrode 170.

In the case in which the light-emitting device package 100, 100A, or 100B shown in FIGS. 1, 2, and 3 is embodied to have a flip-chip bonding structure shown in FIG. 4, which will be described below, light emitted from the active layer 124 may be output through the first electrode 170 as well as the first conductive semiconductor layer 122 and the upper substrate 110. To this end, the first electrode 170 as well as the first conductive semiconductor layer 122 and the upper substrate 110 may be made of a material that exhibits optical transparency. The second conductive semiconductor layer 126 may be made of a transparent, opaque, or reflective material. However, the disclosure is not limited to any specific material.

That is, each of the first electrode 170 and the conductive capping layer 160A or 160B may be formed of a material that does not absorb the light emitted from the active layer 124 but may reflect or transmit the light and that may grow with high quality on the first and second conductive semiconductor layers 122 and 126. For example, each of the first electrode 170 and the conductive capping layer 160A or 160B may be formed of metal, and may include at least one of Cr, Cu, Ti, Ag, Ni, Al, Rh, Pd, Ir, Ru, Mg, Zn, Pt, Au, or Hf.

In addition, each of the conductive capping layer 160A or 160B and the first electrode 170 may have a plurality of layers. For example, the conductive capping layer 160A or 160B may have a structure in which an adhesive layer (not shown), a barrier layer (not shown), and a bonding layer (not shown) are sequentially stacked. The adhesive layer may include a material that ohmically contacts the reflective layer 150A and the transparent electrode layer 130A. For example, the adhesive layer may be formed of at least one of Cr, Rd, or Ti, and may have a single- or multi-layer structure.

The barrier layer may be disposed on the adhesive layer. The barrier layer may be formed of a material including at least one of Ni, Cr, Ti, or Pt, and may have a single- or multi-layer structure. For example, the barrier layer may be formed of an alloy of Cr and Pt.

In addition, a reflective layer formed of Ag may be interposed between the barrier layer and the adhesive layer. The reflective layer may be omitted. The bonding layer may be disposed on the barrier layer, and may include Au.

For example, each of the conductive capping layer 160A or 160B and the first electrode 170 may have a structure in which Cr/Al/Ni/Cu/Ni/Ti or Ti/Al are sequentially stacked in the direction in which the first and second pads 192 and 194 are viewed from the light-emitting structure 120.

In addition, the third width W3 of the conductive capping layer 160A or 160B may be greater than the first width W1 of the reflective layer 150A or 150B or the second width W2 of the transparent electrode layer 130A or 130B.

If the 1-1 distance d11 is less than 5 µm, process defects may occur. If the 1-2 distance d12 is less than 5 µm, the sidewall of the conductive capping layer 160A or 160B and the first electrode 170 may contact each other, whereby defects may occur. Consequently, the minimum value of each of the 1-1 and 1-2 distances d11 and d12 may be 5 µm. The maximum value of the third width W3 may be set depending on the chip size of the light-emitting device package 100A or 100B within a range that satisfies the minimum value of each of the 1-1 distance d11 and the 1-2 distance d12.

Also, if each of the 1-3 distance d13 and the 1-4 distance d14 is less than 5 µm, the conductive capping layer 160A or 160B cannot perform a capping function. Consequently, the minimum value of each of the 1-3 and 1-4 distances d13 and d14 may be 5 µm. The minimum value of the third width W3 may be set depending on the chip size of the light-emitting device package 100A or 100B within a range that satisfies the minimum value of each of the 1-3 distance d13 and the 1-4 distance d14.

In addition, the dielectric layer 180 is disposed between the conductive capping layer 160A or 160B and the first pad 192 to electrically separate the conductive capping layer 160A or 160B and the first pad 192 from each other. In addition, the dielectric layer 180 may be disposed between the second pad 194 and the first electrode 170 to electrically separate the second pad 194 and the first electrode 170 from each other. In the light-emitting device package 100, 100A, or 100B according to the embodiment, the conductive capping layer 160A or 160B may function as a second electrode.

In addition, the dielectric layer 180 may be embodied by a distributed Bragg reflector (DBR). In this case, the dielectric layer 180 as well as the reflective layer 150A or 150B performs a reflecting function. In the case in which the light-emitting device package 100, 100A, or 100B is embodied to have a flip bonding structure, as shown in FIG. 4, which will be described below, therefore, a larger amount of light that is directed to first and second lead frames 212 and 214 after being emitted from the active layer 124 may be reflected, whereby the light emission performance of the light-emitting device package 100, 100A, or 100B may be improved.

The first pad 192 may be electrically connected to the first electrode 170 by passing through the dielectric layer 180. The second pad 194 may be electrically connected to the conductive capping layer 160A or 160B by passing through the dielectric layer 180. Each of the first and second pads 192 and 194 may include a metal material having electrical conductivity, and may include a material identical to or different from the material of each of the first electrode 170 and the conductive capping layer 160A or 160B.

FIG. 4 is a sectional view of a light-emitting device package 200 having a flip-chip bonding structure.

The light-emitting device package 200 shown in FIG. 4 may further include first and second lead frames 212 and 214, a dielectric part 220, first and second solder parts 232 and 234, a molding member 240, and a package body 250, in addition to the light-emitting device package 100A shown in FIG. 2. The light-emitting device package 100A included in the light-emitting device package 200 shown in FIG. 4 is identical to the light-emitting device package shown in FIG. 2, and therefore a duplicate description thereof will be omitted.

The light-emitting device package 200 shown in FIG. 4 is shown as including the light-emitting device package 100A shown in FIG. 2. However, the disclosure is not limited thereto. In another embodiment, the light-emitting device package 200 shown in FIG. 4 may include the light-emitting device package 100B shown in FIG. 3, rather than the light-emitting device package 100A shown in FIG. 2.

Referring to FIG. 4, the light-emitting device package 100A shown in FIG. 2 may be disposed in a cavity C. Here, the cavity C may be defined by the first and second lead frames 212 and 214 and the package body 250. That is, the cavity C may be defined by the inner surface of the package body 250 and the upper surface of each of the first and second lead frames 212 and 214. However, the disclosure is not limited thereto.

In another embodiment, the cavity C may be defined by only the package body 250, unlike what is shown in FIG. 4. Alternatively, a barrier wall (not shown) may be disposed on the package body 250, the upper surface of which is flat, and the cavity may be defined by the barrier wall and the upper surface of the package body 250.

The package body 250 may be embodied by an epoxy molding compound (EMC). However, the disclosure is not limited as to the material of the package body 250.

The first solder part 232 may be disposed between the first pad 192 and the first lead frame 212 to electrically connect the first pad 192 and the first lead frame 212 to each other, and the second solder part 234 may be disposed between the second pad 194 and the second lead frame 214 to electrically connect the second pad 194 and the second lead frame 214 to each other. Each of the first and second solder parts 232 and 234 may be solder paste or a solder ball, and may include a material such as Sn. However, the disclosure is not limited to the specific material of each of the first and second solder parts 232 and 234.

The first and second solder parts 232 and 234 electrically connect the first and second conductive semiconductor layers 122 and 126 to the first and second lead frames 212 and 214 through the first and second pads 192 and 194, respectively, whereby wires may be obviated. In another embodiment, however, the first and second conductive semiconductor layers 122 and 126 may be connected respectively to the first and second lead frames 212 and 214 using wires.

In addition, the first solder part 232 and the second solder part 234 may be omitted. In this case, the first pad 192 may serve as the first solder part 232, and the second pad 194 may serve as the second solder part 234. In the case in which the first solder part 232 and the second solder part 234 are omitted, the first pad 192 may be directly connected to the first lead frame 212, and the second pad 194 may be directly connected to the second lead frame 214.

The first and second lead frames 212 and 214 may be disposed so as to be electrically isolated from each other. Each of the first and second lead frames 212 and 214 may be formed of a conductive material, such as metal. However, the disclosure is not limited as to the kind of the material of each of the first and second lead frames 212 and 214.

Also, in the case in which the package body 250 is formed of a conductive material, e.g. metal, the first and second lead frames 212 and 214 may form a portion of the package body 250. Even in this case, the first and second lead frames 212 and 214 constituting the package body 250 may be electrically isolated from each other by the dielectric part 220.

The dielectric part 220 is disposed between the first and second lead frames 212 and 214 to electrically isolate the first and second lead frames 212 and 214 from each other. Each of the passivation layer 140, the dielectric layer 180, and the dielectric part 220 may include at least one of $SiO_2$, $TiO_2$, $ZrO_2$, $Si_3N_4$, $Al_2O_3$, or $MgF_2$. However, the disclosure is not limited as to the material of each of the passivation layer 140, the dielectric layer 180, and the dielectric part 220.

In addition, the molding member 240 may be disposed while surrounding the light-emitting structure 120 and the first and second solder parts 232 and 234 in order to protect the light-emitting structure 120 and the first and second solder parts 232 and 234 by surrounding the light-emitting structure 120 and the first and second solder parts 232 and 234. The molding member 240 may be embodied by, for example, silicon (Si). Since a phosphor is included, the molding member 240 may change the wavelength of the light emitted from the light-emitting device package 100A. The phosphor may include any one of YAG-based, TAG-based, silicate-based, sulfide-based, and nitride-based fluorescent materials, which are wavelength conversion means and may convert the light emitted from the light-emitting device package 100A into white light. However, the disclosure is not limited as to the kind of the phosphor.

(Y, Tb, Lu, Sc, La, Gd, Sm)3(Al, Ga, In, Si, Fe)5(O, S)12:Ce may be selectively used as the YAG-based and TAG-based fluorescent materials, and (Sr, Ba, Ca, Mg)2SiO4: (Eu, F, Cl) may be selectively used as the silicate-based nitride-based fluorescent material.

In addition, (Ca, Sr)S:Eu, (Sr, Ca, Ba) (Al, Ga)2S4:Eu may be selectively used as the sulfide-based fluorescent material, and (Sr, Ca, Si, Al, O)N:Eu (e.g. CaAlSiN4:Eu β-SiAlON:Eu), Ca-α SiAlON:Eu-based (Cax, My)(Si, Al)12(O, N)16 (where M is at least one of Eu, Tb, Yb, or Er, $0.05<(x+y)<0.3$, $0.02<x<0.27$, and $0.03<y<0.3$), or a phosphor constituent may be selectively used as the nitride-based fluorescent material.

A nitride-based phosphor including N (e.g. CaAlSiN3:Eu) may be used as a red phosphor. The nitride-based red phosphor exhibits greater ability to withstand the external environment, such as heat or moisture, and lower discoloration than a sulfide-based phosphor.

Hereinafter, a method of manufacturing the light-emitting device package 100A shown in FIG. 2 will be described with reference to FIGS. 5a to 5f and 6a to 6g. Of course, however, the light-emitting device package 100A shown in FIG. 2 may be manufactured using a method different from the method shown in FIGS. 5a to 5f and 6a to 6g. In addition, the light-emitting device package 100B shown in FIG. 3 may be manufactured using a modification of the method shown in FIGS. 5a to 5f and 6a to 6g. For the convenience of description and the clarity of drawings, the transparent electrode layer 130A of the light-emitting device package 100A shown in FIG. 2 will be described as not including the fourth transparent segment S14.

FIGS. 5a to 5f are process plan views illustrating a method of manufacturing the light-emitting device package 100A shown in FIG. 2, and FIGS. 6a to 6g are process sectional views illustrating the method of manufacturing the light-emitting device package 100A shown in FIG. 2.

As shown in FIG. 6a, a light-emitting structure 120 is formed on a substrate 110. That is, a first conductive semiconductor layer 122, an active layer 124, and a second conductive semiconductor layer 126 are sequentially stacked on the substrate 110 to form the light-emitting structure 120.

The first conductive semiconductor layer 122 may be formed of a group III-V or II-VI compound semiconductor doped with a first conductive dopant. In the case in which the first conductive semiconductor layer 122 is an n-type semiconductor layer, the first conductive dopant may include Si, Ge, Sn, Se, or Te as an n-type dopant. However, the disclosure is not limited thereto.

For example, the first conductive semiconductor layer 122 may be formed of a semiconductor material described by the formula $Al_xIn_yGa_{(1-x-y)}N$ ($0 \leq x \leq 1$, $0 \leq y \leq 1$, $0 \leq x+y \leq 1$). The first conductive semiconductor layer 122 may be formed of at least one of GaN, InN, AlN, InGaN, AlGaN, InAlGaN, AlInN, AlGaAs, InGaAs, AlInGaAs, GaP, AlGaP, InGaP, AlInGaP, or InP.

The active layer 124 may be formed so as to have at least one of a single-well structure, a multi-well structure, a single-quantum-well structure, a multi-quantum-well (MQW) structure, a quantum-wire structure, or a quantum-dot structure.

A well layer/barrier layer of the active layer 124 may be formed so as to include at least one of InGaN/GaN, InGaN/InGaN, GaN/AlGaN, InAlGaN/GaN, GaAs(InGaAs)/AlGaAs, or GaP(InGaP)/AlGaP, which are pairs of structures. However, the disclosure is not limited thereto. The well layer may be formed of a material having lower band gap energy than the barrier layer.

A conductive clad layer (not shown) may be formed on and/or under the active layer 124. The conductive clad layer may be formed of a semiconductor having higher band gap energy than the barrier layer of the active layer 124. For example, the conductive clad layer may be formed of GaN, AlGaN, InAlGaN, or a super-lattice structure. In addition, the conductive clad layer may be doped as an n-type or p-type semiconductor.

The second conductive semiconductor layer 126 may be formed of a compound semiconductor, and may be embodied by a group III-V or II-VI compound semiconductor. For example, the second conductive semiconductor layer 126 may be formed of a semiconductor material described by the formula $In_xAl_yGa_{(1-x-y)}N$ ($0 \leq x \leq 1$, $0 \leq y \leq 1$, $0 \leq x+y \leq 1$). The second conductive semiconductor layer 126 may be doped with a second conductive dopant. In the case in which the second conductive semiconductor layer 126 is a p-type semiconductor layer, the second conductive dopant may include Mg, Zn, Ca, Sr, or Ba as a p-type dopant.

Subsequently, referring to FIGS. 5a and 6b, the second conductive semiconductor layer 126, the active layer 124, and a portion of the first conductive semiconductor layer 122 are etched by mesa etching to form a first through-hole TH1, through which the first conductive semiconductor layer 122 is exposed. As shown in FIG. 5a, the first through-hole TH1 may include a 1-1 through-hole TH11, through which a first conductive semiconductor layer 122-1 is exposed in the planar shape of a circle, and a 1-2 through-hole TH12, through which the first conductive semiconductor layer 122-1 is exposed in the planar shape of an elongated stripe.

Subsequently, referring to FIGS. 5b and 6c, a passivation layer 140 is formed so as to extend from the edge of the upper part of the second conductive semiconductor layer 126 to the exposed upper part of the first conductive semiconductor layer 122-1 while surrounding the sidewall of the light-emitting structure 120. The passivation layer 140 may include at least one of $SiO_2$, $TiO_2$, $ZrO_2$, $Si_3N_4$, $Al_2O_3$, or $MgF_2$. However, the disclosure is not limited as to the material of the passivation layer 140. In addition, the passivation layer 140 may be formed in the shape of a distributed Bragg reflector.

Subsequently, referring to FIGS. 5c and 6d, a transparent electrode layer 130A is formed from the upper part of the second conductive semiconductor layer 126 to the upper part of the passivation layer 140. The transparent electrode layer 130A may be formed of a transparent conductive oxide (TCO). For example, the transparent electrode layer 130A may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO. However, the disclosure is not limited thereto.

Subsequently, referring to FIGS. 5d and 6e, a reflective layer 150A is formed on the transparent electrode layer 130A. Here, the reflective layer 150A may be formed at a first transparent segment S11 and a second transparent segment S12 of the transparent electrode layer 130A. The reflective layer 150A may be formed of a reflective material, such as Ag, Al, Ru, Rh, Pt, Pd, or a selective combination thereof.

Subsequently, referring to FIGS. 5e and 6f, a conductive capping layer 160A is formed so as to surround the reflective layer 150A, and at the same time a first electrode 170 is formed. The conductive capping layer 160A and the first electrode 170 may be formed of the same material.

Each of the first electrode 170 and the conductive capping layer 160A may be formed of metal, and may be formed of Cr, Cu, Ti, Ag, Ni, Al, Rh, Pd, Ir, Ru, Mg, Zn, Pt, Au, Hf, or a selective combination thereof. For example, each of the conductive capping layer 160A and the first electrode 170 may be formed to have a plurality of layers. At this time, each of the conductive capping layer 160A and the first electrode 170 may have a structure in which Cr/Al/Ni/Cu/Ni/Ti or Ti/Al are sequentially stacked from bottom to top.

In the case in which the first electrode 170 and the conductive capping layer 160A are simultaneously formed of the same material, no additional process for forming the conductive capping layer 160A is required, whereby complication of the process is avoided.

Subsequently, referring to FIGS. 5f and 6g, a dielectric layer 180 is formed while a portion of the upper part of the conductive capping layer 160A, which serves as a second electrode, is exposed and a portion of the upper part of the first electrode 170 is exposed. The dielectric layer 180 may be formed of at least one of $SiO_2$, $TiO_2$, $ZrO_2$, $Si_3N_4$, $Al_2O_3$, or $MgF_2$. However, the disclosure is not limited as to the material of the dielectric layer 180.

The sectional view of FIG. 2 except for the first and second pads 192 and 194 corresponds to the sectional view taken along line I-I' of FIG. 5f.

Hereinafter, a comparison between a light-emitting device package according to a comparative example and the light-emitting device package according to the embodiment will be described.

FIGS. 7a and 7b are plan views of a light-emitting device package according to a comparative example, and FIG. 8 is a sectional view taken along II-II' of FIGS. 7a and 7b.

Referring to FIGS. 7a, 7b, and 8, the light-emitting device package according to the comparative example includes a substrate 10, a light-emitting structure 20, ITO 30, a metal reflective layer 40, and an n-type electrode 50.

The light-emitting structure 20 includes an n-type semiconductor layer 22, a light-emitting layer 24, and a p-type semiconductor layer 26.

The light-emitting device package according to the comparative example shown in FIGS. 7a, 7b, and 8 does not include the conductive capping layer 160A or 160B shown in FIGS. 2 and 3. In this case, the material constituting a solder to be connected to the metal reflective layer 40 is diffused to the metal reflective layer 40 (300 and 302). As a result, the reflecting function of the metal reflective layer 40 may become weak, whereby the amount of light emitted by the light-emitting device package according to the comparative example may be reduced.

In the embodiment, however, the conductive capping layer 160A or 160B is disposed between the second solder part 234 and the reflective layer 150A or 150B. Consequently, the material constituting the second solder part 234 is prevented from diffusing to the reflective layer 150A or 150B thanks to the presence of the conductive capping layer 160A or 160B. That is, the aforementioned barrier layer of the conductive capping layer 160A or 160B may prevent the material constituting the solder part 234 from diffusing to the reflective layer 150A or 150B. Since the barrier layer of the conductive capping layer 160A or 160B serves as a diffusion-preventing layer, the occurrence of defects may be prevented. In addition, since deterioration in the reflecting function of the reflective layer 150A or 150B is prevented, a reduction in the amount of light may be prevented.

Also, in the case in which the reflective layer 40 is disposed on the ITO 30, as shown in FIG. 8, the material constituting the reflective layer 40 may migrate to the light-emitting structure 20 or may agglomerate, or the reflective layer 40 may peel off the ITO 30. For these reasons, the width of the reflective layer 40 must be less than the width of the ITO 30. That is, referring to FIG. 8, the third distance d3, from the left end of the reflective layer 40 to the left end of the ITO 30, must be maintained at 20 µm, and the fourth distance d4, from the right end of the reflective layer 40 to the right end of the ITO 30, must also be maintained at 20 µm.

In the light-emitting device package according to the embodiment, however, the conductive capping layer 160A or 160B is disposed so as to surround the reflective layer 150A or 150B, whereby the reflective layer 150A or 150B may be deposited on the entire surface of the transparent electrode layer 130A or 130B. Consequently, the deposition area of the reflective layer 150A or 150B may be increased. For example, the second distance d2 shown in FIGS. 2 and 3 is less than the third distance d3 shown in FIG. 8.

In FIGS. 2 and 3, the second distance d2 may be 0 µm, since the conductive capping layer 160A or 160B is disposed so as to surround the reflective layer 150A or 150B. Also, if the second distance d2 is greater than 10 µm, the area of the reflective layer 150A or 150B is reduced, whereby light may be lost. Consequently, the second distance d2 may range from 0 µm to 10 µm. However, the disclosure is not limited thereto.

In addition, the reflective layer 150A extends to the upper part of the transparent electrode layer 130A disposed on the passivation layer 140, as shown in FIG. 2, or the reflective layer 150B is disposed over the transparent electrode layer 130B and the passivation layer 140, as shown in FIG. 3. As a result, the deposition area of the reflective layer 150A or 150B may be further increased. That is, the fourth distance d4 shown in FIG. 8 may be reduced to 0 µm.

Furthermore, the migration, agglomeration, or peeling off of the reflective layer 150A or 150B may be prevented, since the conductive capping layer 160A or 160B is disposed so as to surround the reflective layer 150A or 150B.

Also, in the case in which the first electrode 170 and the conductive capping layer 160A or 160B are formed simultaneously, an additional process of forming the conductive capping layer 160A or 160B is omitted, whereby the manufacturing process may be simplified and manufacturing costs may be reduced.

A plurality of light-emitting device packages according to an embodiment may be arrayed on a board. Optical members, such as a light guide plate, a prism sheet, and a diffusion sheet, may be disposed in the path of the light emitted from the light-emitting device packages. The light-emitting device packages, the board, and the optical members may function as a backlight unit.

In addition, the light-emitting device packages according to the embodiment may be included in a display apparatus, an indicator, or a lighting apparatus.

The display apparatus may include a bottom cover, a reflection plate disposed on the bottom cover, a light-emitting module for emitting light, a light guide plate disposed in front of the reflection plate for guiding the light emitted by the light-emitting module forward, an optical sheet including prism sheets disposed in front of the light guide plate, a display panel disposed in front of the optical sheet, an image signal output circuit connected to the display panel for providing an image signal to the display panel, and a color filter disposed in front of the display panel. The bottom cover, the reflection plate, the light-emitting module, the light guide plate, and the optical sheet may constitute a backlight unit.

The lighting apparatus may include a light source module including a board and light-emitting device packages according to an embodiment, a heat sink for dissipating the heat generated from the light source module, and a power supply unit for processing or converting an electrical signal received from the outside and providing the processed or converted signal to the light source module. For example, the lighting apparatus may include a lamp, a headlamp, or a streetlight.

The headlamp may include a light-emitting module including light-emitting device packages disposed on a board, a reflector for reflecting the light emitted by the light-emitting module in a predetermined direction, for example forward, a lens for refracting the light reflected by the reflector forward, and a shade for blocking or reflecting a portion of the light reflected by the reflector and directed to the lens to achieve the light distribution pattern desired by a designer.

Although embodiments have been described with reference to a number of illustrative embodiments thereof, it should be understood that the embodiments are illustrative and not restrictive and that numerous other modifications and applications may be devised by those skilled in the art that will fall within the intrinsic aspects of the embodiments. For example, various variations and modifications are possible in concrete constituent elements of the embodiments. In addition, it is to be understood that differences relevant to the variations and modifications fall within the spirit and scope of the present disclosure defined in the appended claims.

Mode for Invention

Various embodiments have been described in the best mode for carrying out the invention.

INDUSTRIAL APPLICABILITY

A light-emitting device package according to an embodiment may be used in a display apparatus, an indicator, or a lighting apparatus.

The invention claimed is:

1. A light-emitting device package, comprising:
   a light-emitting structure comprising first and second conductive semiconductor layers and an active layer disposed between the first and second conductive semiconductor layers;
   a transparent electrode layer disposed on the second conductive semiconductor layer;
   a passivation layer disposed on the second conductive semiconductor layer and on the first conductive semiconductor layer, which is exposed by mesa etching;
   a reflective layer disposed so as to extend from an upper part of the transparent electrode layer to an upper part of the passivation layer in a horizontal direction, which is perpendicular to a thickness direction of the light-emitting structure; and
   a conductive capping layer disposed on the reflective layer,
   wherein the transparent electrode layer comprises:
      a first transparent segment disposed between the reflective layer and the light-emitting structure; and
      a fourth transparent segment extending from the first transparent segment in the horizontal direction so as to be disposed between the conductive capping layer and the light-emitting structure.

2. A light-emitting device package, comprising:
   a light-emitting structure comprising first and second conductive semiconductor layers and an active layer disposed between the first and second conductive semiconductor layers;
   a transparent electrode layer disposed on the second conductive semiconductor layer;
   a passivation layer disposed on the second conductive semiconductor layer and on the first conductive semiconductor layer, which is exposed by mesa etching;
   a reflective layer disposed so as to extend from an upper part of the transparent electrode layer to an upper part of the passivation layer in a horizontal direction, which is perpendicular to a thickness direction of the light-emitting structure; and
   a conductive capping layer disposed on the reflective layer,
   wherein the transparent electrode layer comprises:
      a first transparent segment disposed between the reflective layer and the light-emitting structure; and
      a second transparent segment extending from the first transparent segment in the horizontal direction so as to be disposed between the reflective layer and the passivation layer.

3. The light-emitting device package according to claim 1 or 2, further comprising:
   a first electrode disposed on the first conductive semiconductor layer, which is exposed by the mesa etching,
   wherein the passivation layer electrically isolates a side part of the light-emitting structure and the first electrode from each other, and
   wherein the conductive capping layer comprises a same material as the first electrode.

4. The light-emitting device package according to claim 3, wherein each of the conductive capping layer and the first electrode comprises at least one of Cr, Al, Ni, Cu, or Ti.

5. The light-emitting device package according to claim 4, wherein each of the conductive capping layer and the first electrode comprises Cr/Al/Ni/Cu/Ni/Ti or Ti/Al.

6. The light-emitting device package according to claim 1, wherein a width of the conductive capping layer in the horizontal direction is greater than a width of the transparent electrode layer in the horizontal direction.

7. The light-emitting device package according to claim 1, wherein a width of the reflective layer in the horizontal direction is greater than a width of the transparent electrode layer in the horizontal direction.

8. The light-emitting device package according to claim 1, wherein the conductive capping layer is disposed so as to surround an upper part and a side part of the reflective layer.

9. The light-emitting device package according to claim 8, wherein the conductive capping layer is disposed so as to wrap a side part of the transparent electrode layer on which the reflective layer is disposed.

10. The light-emitting device package according to claim 1, wherein the reflective layer comprises:
    a first reflective segment disposed so as to overlap the light-emitting structure, the transparent electrode layer, and the conductive capping layer in the thickness direction; and
    a second reflective segment extending from the first reflective segment in the horizontal direction so as to overlap the light-emitting structure, the conductive capping layer, and the passivation layer in the thickness direction.

11. The light-emitting device package according to claim 10, wherein the second reflective segment further overlaps the transparent electrode layer in the thickness direction.

12. The light-emitting device package according to claim 1, wherein the first transparent segment is disposed so as to contact the passivation layer in the horizontal direction.

13. The light-emitting device package according to claim 3, further comprising:
    a dielectric layer disposed between the conductive capping layer and the first electrode;
    a first pad connected to the first electrode by passing through the dielectric layer; and
    a second pad connected to the conductive capping layer by passing through the dielectric layer, the second pad being isolated from the first pad.

14. The light-emitting device package according to claim 13, further comprising:
    a first solder part connected to the first pad; and
    a second solder part connected to the second pad.

15. The light-emitting device package according to claim 14, further comprising:
    first and second lead frames disposed so as to be electrically isolated from each other; and
    a dielectric part disposed between the first and second lead frames,
    wherein the first solder part is disposed between the first lead frame and the first pad, and
    the second solder part is disposed between the second lead frame and the second pad.

16. The light-emitting device package according to claim 14, further comprising a molding member disposed so as to surround the light-emitting structure.

17. The light-emitting device package according to claim 1, wherein the conductive capping layer surrounds opposite sides of the stepped portion and two opposite outermost sides of the reflective layer, and
    wherein the conductive capping layer surrounds at least one of two opposite sides of the transparent electrode layer.

18. The light-emitting device package according to claim 2, wherein the transparent electrode layer further comprises a third transparent segment extending from the second transparent segment in the horizontal direction so as to be disposed between the conductive capping layer and the passivation layer.

19. The light-emitting device package according to claim 18, wherein the transparent electrode layer further comprises a fourth transparent segment extending from the first transparent segment in the horizontal direction so as to be disposed between the conductive capping layer and the light-emitting structure.

20. The light-emitting device package according to claim 19, wherein the reflective layer is disposed on the fourth transparent segment.

* * * * *